(12) United States Patent
Wang et al.

(10) Patent No.: US 8,627,241 B2
(45) Date of Patent: Jan. 7, 2014

(54) PATTERN CORRECTION WITH LOCATION EFFECT

(75) Inventors: Hung-Chun Wang, Taichung (TW); Ming-Hui Chih, Luzhou (TW); Cheng Kun Tsai, Hsinchu (TW); Wen-Chun Huang, Tainan (TW); Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/447,857

(22) Filed: Apr. 16, 2012

(65) Prior Publication Data

US 2013/0275925 A1    Oct. 17, 2013

(51) Int. Cl.
*G06F 17/50* (2006.01)
(52) U.S. Cl.
USPC .............. 716/53; 716/50; 716/54; 716/55
(58) Field of Classification Search
USPC ........................................ 716/53, 50, 54, 55
See application file for complete search history.

(56) References Cited

U.S. PATENT DOCUMENTS

| | | | |
|---|---|---|---|
| 8,381,153 B2 | 2/2013 | Chiang et al. | |
| 2004/0076891 A1* | 4/2004 | Pierrat | 430/5 |
| 2005/0081179 A1* | 4/2005 | Melvin | 716/20 |
| 2008/0301611 A1* | 12/2008 | Word et al. | 716/9 |
| 2010/0064274 A1* | 3/2010 | Grimm | 716/21 |

\* cited by examiner

*Primary Examiner* — Vuthe Siek
*Assistant Examiner* — Magid Dimyan
(74) *Attorney, Agent, or Firm* — Haynes and Boone, LLP (57) ABSTRACT

The present disclosure provides one embodiment of an integrated circuit (IC) method. The method includes receiving an IC design layout having a plurality of IC regions each including an IC pattern; performing a dissection process to the IC design layout; and performing a correction process to the IC design layout using a correction model that includes proximity effect and location effect. The correction process includes performing a first correction step to a first IC region of the IC regions, resulting in a first corrected IC pattern in the first IC region; and performing a second correction step to a second IC region of the IC regions, starting with the first corrected IC pattern, resulting in a second corrected IC pattern.

18 Claims, 5 Drawing Sheets

PATTERN CORRECTION WITH LOCATION EFFECT

BACKGROUND

The integrated circuit (IC) design is more challenging when semiconductor technologies are continually progressing to smaller feature sizes, such as 65 nanometers, 45 nanometers, and below. The performance of a chip design is seriously influenced by the control of resistance/capacitance (RC), timing, leakage, and topology of the metal/dielectric inter-layers. Those are further related to resolution of the lithography patterning and the imaging accuracy.

To enhance the imaging effect when a design pattern is transferred to a wafer, an optical proximity correction (OPC) to minimize the proximity effect is indispensable. The design pattern is adjusted to generate an image on the wafer with improved resolution.

However, along with the progress of the lithography patterning, some other imaging effect are unavoidable and those imaging factors are location related. Those other imaging factors are not fully considered and not effectively corrected or efficiently corrected. For N28 nodes and below, the severity of main feature distortion caused by those imaging effect generates many side effects with significant impact, which is unacceptable in term of device performance, quality and reliability.

Therefore, what is needed is a method for IC design and mask making to effectively and efficiently tuning IC pattern to address the above issue.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figures 1, 2:
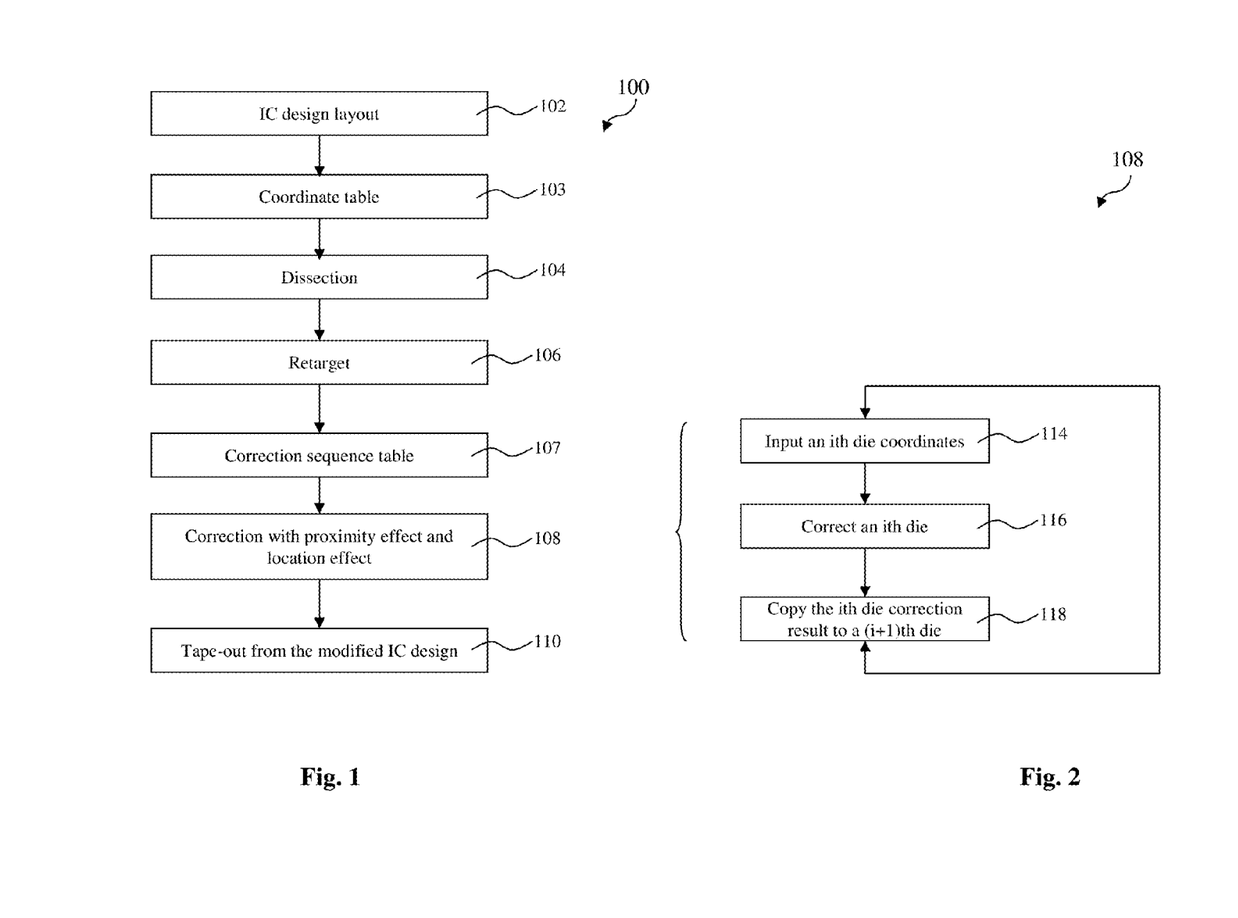
FIG. 1 is a flowchart of an embodiment of an integrated circuit (IC) method constructed according to aspects of the present disclosure.
FIG. 2 is a flowchart of a model-based correction of the IC method in FIG. 1 constructed according to aspects of the present disclosure in one embodiment.
Figure 3:
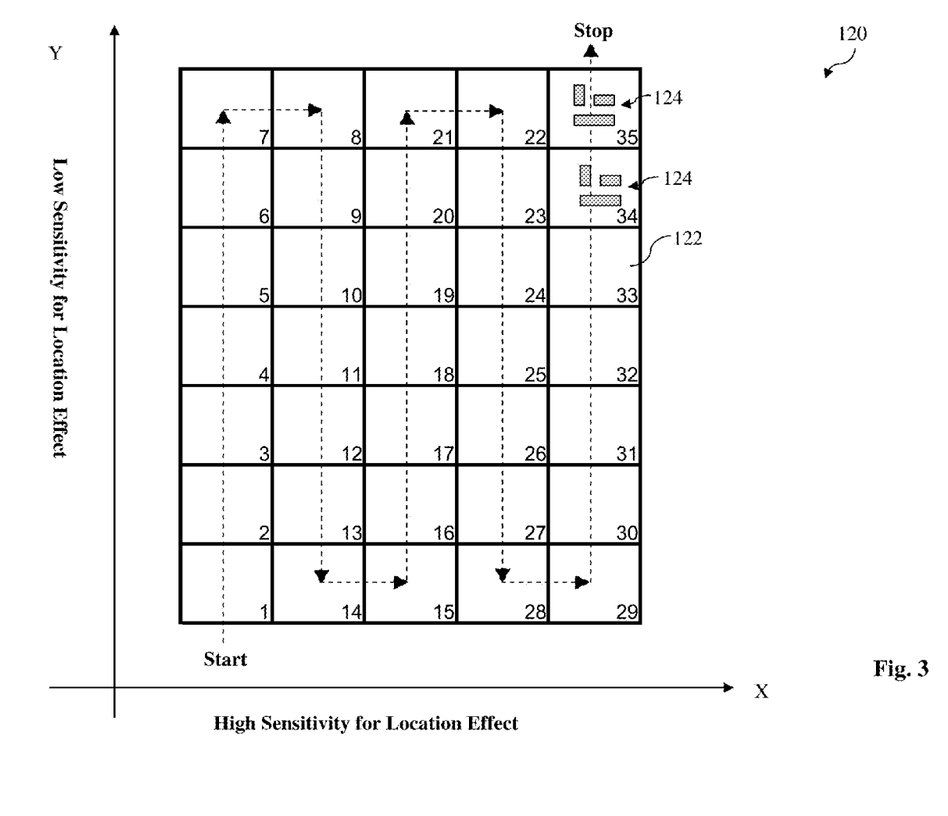
FIG. 3 is a schematic view of an IC design pattern constructed according to aspects of the present disclosure in one embodiment.
Figure 4:
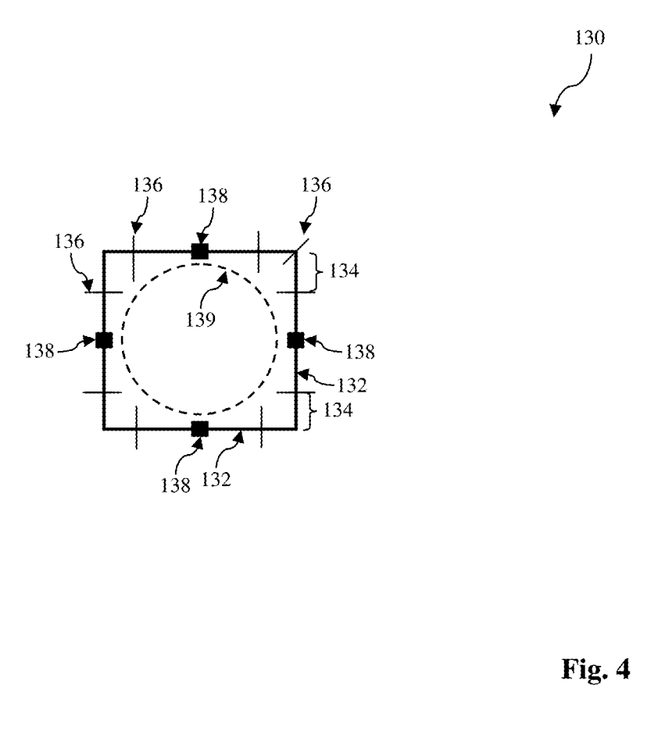
FIG. 4 illustrates one embodiment of a main feature of the IC design layout of FIG. 3.

FIG. 1 is a flowchart of a method 100 for integrated circuit (IC) designing constructed according to various aspects of the present disclosure in one or more embodiments. FIG. 2 is a flowchart of a model-based correction of the IC design method 100 in one embodiment. FIG. 3 is a schematic view of an IC design pattern constructed according to aspects of the present disclosure in one embodiment. FIG. 4 illustrates an exemplary main feature of the IC design layout according to one embodiment.

The disclosed method 100 provides an IC design approach to collectively consider both proximate effect and location effect, and effectively tune/modify the IC design layout accordingly for improved imaging during a lithography process. The proximate effect refers to an imaging effect during a lithography process that an imaging variation is introduced by approximate features. For example, a pattern feature in an environment with a dense pattern and an identical feature in an isolated environment would result in images with different critical dimensions (CDs). The IC design layout can be tuned by resizing, reshaping, adding assist features, adding scattering bars or combinations according to the proximate effect to improve the image. This method is referred to as optical proximate correction (OPC).

The location effect refers to the imaging effect during a lithography process that an imaging variation is introduced by and is associated with the location of the respective pattern feature in the IC design layout. For example, when the lithography process uses an extreme ultraviolet (EUV) light, the EUV beam is tilted to the optical axis of the lithography system, such as with a tilt angle of about 6 degree. A shadow effect is introduced by the tilt illumination and causes an image distortion that is dependent on the location of the pattern feature to be imaged. In different perspective, the proximate effect is related to a local environment on the IC design layout while the location effect is related to a global location on the IC design layout. The location effect can be reduced by tuning the IC design layout, including resizing, reshaping, adding assist features, adding scattering bars or combinations. This method is referred to as location effect correction (LEC). Particularly, the location of the pattern feature in the IC design layout is a factor to be considered during LEC.

In one embodiment where lithography process uses an EUV lithography, the location effect includes shadow effect, flare effect, border effect, resist heating effect, baking effect, develop effect or combinations thereof. In another embodiment where the lithography process uses electron beam (or e-beam) direct write (EBDW), the location effect includes fogging effect, flare effect, resist heating effect, baking effect, develop effect or combinations thereof.

The method 100 is described with reference to FIGS. 1 through 4. The method 100 begins at step 102 by receiving an IC design layout (or IC design pattern) from a designer. In one example, the designer can be a design house. In another example, the designer is a design team separated from a semiconductor manufacturer assigned for making IC products according to the IC design layout. In various embodiments, the semiconductor manufacturer is capable for making photomasks, semiconductor wafers, or both. The IC design layout includes various geometrical patterns designed for an IC product and based on the specification of the IC product.

The IC design layout is presented in one or more data files having the information of geometrical patterns. In one example, the IC design layout is expressed in a "gds" format known in the art. The designer, based on the specification of the product to be manufactured, implements a proper design procedure to carry out the IC design layout. The design procedure may include logic design, physical design, and place and route. As an example, a portion of the IC design layout includes various IC features (also referred to as main features), such as active region, gate electrode, source and drain, metal lines or via of the interlayer interconnection, and openings for bonding pads, to be formed on a semiconductor substrate (such as a silicon wafer) or on various material layers disposed over the semiconductor substrate. The IC design layout may include certain additional features, such as those features for imaging effect, processing enhancement, and/or mask identification information.

An exemplary IC design layout 120 is shown in FIG. 3 for illustration. In one embodiment, the IC design layout 120 is defined with in a plurality of regions 122 each including a same IC pattern 124, as illustrated in two IC regions. In one example, each IC region 122 defines an IC die and the IC pattern 124 in the IC die. The IC design layout 120 includes multiple IC regions 122, disposed in different places of the IC design layout 120 and labeled as 1, 2, 3, ..., i, (i+1), ..., and N, respectively. In the present example, the IC design layout 120 includes 35 IC regions 122.

The IC design layout 120 or the IC pattern 124 in each region 122 includes a plurality of main features. A main feature is a pattern that defines an IC feature, such as contact/via hole, to be formed on a semiconductor substrate. One exemplary main feature 130 is a square feature defined by its edges 132 as illustrated in FIG. 4.

The method 100 may proceed to step 103 by providing a coordinate table associated with the IC design layout. The coordinate table includes the coordinates of the IC regions 122 in the IC design layout 120. With the IC pattern and the coordinates of each IC region, the IC design layout 120 is well defined since the location of each IC region is given by the respective coordinates and the pattern in the IC region is the IC pattern 124. In one particular example, the coordinates of i-th IC region include two numbers $X_i$ and $Y_i$, representing its location relative to X axis and Y axes.

The method 100 proceeds to step 104 by performing a dissection process to the IC design layout. In one example, the dissection process is applied to each of the main features in the IC design layout. The dissection process includes dissecting edges of a main feature into a plurality of segments such that each segment can be independently adjusted during the subsequent steps for OPC and LEC. More segments dissected from a main feature, more freedom to tune the pattern of the main feature but more time cost as well.

Take the main feature 130 in FIG. 4 as an example. The dissection is applied to the main feature 130 to generate multiple segments 134 defined by dissection points (or stitching points) 136, as illustrated in FIG. 4. In one embodiment, the dissection points or a subset thereof are assigned to the corners of the main feature 130. In another embodiment, the dissection points or a subset thereof are assigned to one edge of the main feature such that the edge is dissected into two or more segments.

Various targets 138 are further assigned to the main feature 130 for simulation verification or other design purposes. The targets are virtual points and represent spatial locations relative to the main features. The targets 138 are used as reference to verify that the modified IC design layout is properly imaged such that the imaged main features hit or close to the targets. Particularly, when a simulated contour 139 of the main feature 130 is generated in a later step by simulation, the targets assigned to the corresponding main feature 130 are checked to verify if the targets hit or are close to the simulated contour 139 of the main feature 130. The contour 139 is a simulated image of the main feature 130 when the main feature 130 is transferred to a product substrate, such as a semiconductor wafer by a lithography process.

The method 100 also includes a step 106 by performing a retargeting process to the IC design layout 120. The retargeting process is a rule-based approach to modify the IC design layout based on various rules (referred to as retarget rules) to improve the imaging when the IC design layout is transferred to a wafer. At the present step, the IC design layout 120 is modified/adjusted according to various retarget rules. In various examples, the retargeting process includes repositioning, resizing, reshaping, adding assist features, adding scattering features, or combinations thereof. In another example, the retargeting process is applied to the main feature 130 such that a subset of the segments of the main feature 130 are adjusted, respectively, according to the retarget rules. The adjustment to a main feature includes moving/relocating the dissected edge segments such that the main feature is reshaped.

The retarget rules include various rules. In one embodiment, the retarget rules include OPC rules used to tune the IC design layout for reduced proximity effect. As noted, the proximity effect is an imaging effect wherein the imaging of a main feature is impacted by other features approximate to that main feature. Rule-based OPC approach includes extracting various OPC rules according to the proximate effect and applying those OPC rules to tune the IC design layout.

In another embodiment, the retarget rules includes LEC rules used to tune the IC design layout for reduced location effect. As noted above, the location effect is related to a global location on the IC design layout. The location effect can be reduced by tuning the IC design layout using rule-based LEC that includes resizing, reshaping, adding assist features, adding scattering bars or combinations. The location of the pattern feature is a factor to be considered during LEC. Rule-based LEC approach includes extracting various LEC rules according to the location effect and applying those LEC rules to tune the IC design layout.

In another embodiment, the retarget rules include design rules. The IC design layout 120 is adjusted according to various design rules, referred to as design rule check (DRC). The various design rules can be extracted from the semiconductor manufacturer in consideration of the manufacturing capability. The IC design follows the design rules in order to generate producible circuit patterns.

In one particular example, the IC design layout 120 is adjusted through a logic operation. In the semiconductor manufacturer, various manufacturing modules convert the manufacturing constraints into a set of rules that the IC design layout 120 has to meet. Otherwise, the IC design layout 120 will be modified accordingly such that the modified IC design layout meets these rules. Such modification is implemented by a logic operation.

In yet another embodiment, the retarget rules includes a combination or a subset of the OPC rules, LEC rules and design rules. In one example, the retarget rules are applied to the IC pattern 122 to tune the IC pattern accordingly, generating a modified IC pattern by the retargeting process. This modified IC pattern is referred to as retargeted IC pattern. Then, the retargeted IC pattern is used to replace the IC pattern in each IC region 122.

The method 100 may proceed to step 107 by providing or generating a correction sequence table. The correction sequence table includes a list of the IC regions 122 arranged in a certain order or sequence. The correction sequence table provides an order that the subsequent correction process is sequentially applied to each IC region of the IC design layout 120. FIG. 3 illustrates one example how the IC regions 122 are arranged in the correction sequence table. In FIG. 3, the IC design layout 120 includes a number (35 in this example) of IC regions configured in an array. The IC regions are labeled with numerals in compliance with the correction sequence table. Particularly, the correction sequence table starts from the IC region "1", then "2", "3", ..., (i+1), ... and "34", and ends at "35".

The correction sequence table is arranged in a way such that adjacent IC regions 122 have less difference in term of the location effect or close sensitivity of the location effect. For example, IC regions 18 and 19 are arranged as adjacent elements in the correction sequence table since those two IC regions have similar or close sensitivity of the location effect. The sensitivity of the location effect is related to or represents the correction quantity by the correction process that considers the location effect. For one example, the sensitivity of the location effect increases along the X direction and decreases along the Y direction.

The correction sequence table may be arranged in different orders. In an alternative example, the sequence may start from 14, 15, 28 or 29.

The method 100 proceeds to step 108 by performing a correction process to the IC design layout 120. The correction process is a model-based approach to tune IC design layout 120, using a simulation model, referred to as correction model. The correction process and the correction model include the location effect. In the present embodiment, the correction process is applied to each IC region 122 of the IC design layout 120 in a sequence defined by the correction sequence table. For example, the correction process is applied to the IC region 1, 2, 3, ..., and N.

When the correction process is applied to each IC region, the IC pattern in the IC region is adjusted by various measures that include repositioning, resizing, reshaping, adding assist features, adding scattering features, or combinations thereof. Then the correction model is applied to the adjusted IC pattern in the IC region to generate a contour. The contour is evaluated to check if the contour satisfies the targets (or target points), which means that the contour hits the targets or is close to the targets within a predefined range. If the targets are not satisfied by the contour, another adjustment is applied to the adjusted IC pattern in the respective IC region. Then another simulation using the correction model is applied to the newly adjusted IC pattern, generating another contour. The generated contour is further checked to see if the targets are satisfied. This correction process is iterated until the assigned targets are satisfied. The final adjusted IC pattern is referred to as corrected IC pattern. Similarly, the final adjusted IC design layout by the correction process is referred to as the corrected IC design layout.

In one embodiment, when the correction process is applied to an IC region, it may applied to each main feature in that IC region, respectively.

Particularly, the correction model used to simulate the contour include an OPC model such that the proximate effect can be effectively simulated. In other words, the contour simulated by the model reflects the impact of the proximate effect to the contour. The correction model also include an LEC model such that the location effect can be effectively simulated. In other words, the contour simulated by the model reflects the impact of the location effect to the contour.

The correction process 108 is further described with reference to FIG. 2, which is a flowchart of the correction process 108 constructed according to one embodiment. The correction process 108 begins at step 114 by inputting the coordinates of "i" (or i-th) IC region from the coordinate table. Therefore, the correction process can be applied to the respective IC region of the IC design layout according to the coordinates. In one example, the coordinates of an IC region represent a reference location, such as the center, of the IC region. The IC design layout 120 includes a plurality of IC regions 122 arranged in the sequence of the correction sequence table. Those arranged IC regions are sequentially labeled as 1, 2, 3, ..., i, (i+1), ..., (N−1) and N.

The correction process 108 includes a step 116 by performing a correction to the i-th IC region. The correction applied to the i-th IC region includes adjusting the IC pattern in the i-th IC region, simulating the contour of the IC pattern in the i-th IC region, and evaluating if the contour satisfies the assigned targets. If not, the above procedure is iterated as many time as needed until the assigned targets are satisfied. In the iteration procedure, the adjusted IC pattern is further adjusted. State differently, the adjusted IC pattern in the previous cycle is used as an input to the next cycle.

The correction process 108 includes a step 118 by copying the corrected IC pattern of the i-th IC region to the (i+1)-th IC region, which means the correction process to the (i+1)-th IC region will use the corrected IC pattern of the i-th IC region as the input. It is more efficient since the adjacent IC regions have similar sensitivity of the location effect. Thus, the correction to the (i+1)-th IC region converges more fast with less iteration cycles.

The correction process 108 then goes back to the step 114 by inputting the coordinates of the (i+1)-th IC region, then step 116 by applying the correction to the (i+1)-th IC region. The initial IC pattern to be used in the (i+1)-th IC region is the corrected IC pattern of the i-th IC region. The correction process 108 including steps 114, 116 and 118 thus is applied to each IC regions sequentially according to the correction sequence table until all IC regions in the IC design layout are exhausted.

The first IC region (IC region "1") in the correction sequence table may take more cycles since the initial IC pattern for the first IC region cannot take the advantages of the previous IC region as the first one in the queue. In the present embodiment, the initial IC pattern of the first IC pattern is the retargeted IC pattern. The correction process to the first IC region uses the retargeted IC pattern as the input. Accordingly, the retargeting result is incorporated into the first IC region and the rest IC region through step 118 since each subsequent IC region has an input from the preceding IC region. Thus, a corrected IC design layout 120 is generated by the correction process.

Referring back to FIG. 1, the method 100 may further include a step by performing a mask rule check (MRC) to the corrected IC design layout 120. At this step, the corrected IC design layout 120 is checked by one or more mask rules and is further modified accordingly. In one embodiment, various mask rules are extracted from the mask fabrication. Various mask making data are collected from the mask fabrication and extracted into a set of rules that the IC design layout, as the pattern to be imaged to a mask, should follow. In one embodiment, the mask rules are applied to various segments of the main features. Those segments that fail one or more mask rules are modified according to the corresponding mask rules.

In another embodiment where the EBDW is used, no mask is fabricated. The IC design layout is directly used in e-beam writing for wafer fabrication. In this case, some other rules may be extracted from the e-beam direct writing, referred to as EBDW rules. Instead of performing the mask rule check, the IC design layout is checked according to the EBDW rules and may be modified according to the EBDW rules such that the EBDW can be properly implemented according to the modified IC design layout.

Still referring to FIG. 1, the method 100 may proceed to step 110 by generating a tape-out of the modified IC design layout for mask making or e-beam writing. The tape-out represents a format of the IC design layout that can be used for mask making or e-beam writing. At this step, the IC design layout may be fractured into a plurality of polygons (or trapezoids). The tape-out is formed based on the IC design layout modified by the correction process.

Other steps may follows. In one embodiment, the method 100 may further proceed to a step for the fabrication of a mask or a group of masks based on the tape-out of the modified IC design layout 120. In one embodiment, an e-beam or a mechanism of multiple e-beams is used to form a pattern on a mask (photomask or reticle) based on the IC design layout. The mask can be formed in various suitable technologies. In one embodiment, the mask is formed using the binary technology. In this case, the mask pattern includes opaque regions and transparent regions. In one example, the binary mask includes a transparent substrate (e.g., fused quartz), and an opaque material (e.g., chromium) coated in the opaque regions of the mask. In another embodiment, the mask is formed using a phase shift technology. In the phase shift mask (PSM), various features in the pattern formed on the mask are configured to have proper phase difference to enhance the resolution and imaging quality. In various examples, the PSM can be an attenuated PSM or an alternating PSM known in the art.

In another embodiment, a semiconductor wafer is fabricated using a mask or a set of masks formed by the above method. The semiconductor wafer includes a silicon substrate or other proper substrate and material layers formed thereon. In this case, an EUV lithography may be used to form semiconductor wafers using the mask(s).

In yet another embodiment, the tape-out of the IC design layout is directly used to pattern a semiconductor wafer by an EBDW lithography apparatus. In either situation (EUV or EBDW), both the proximate effect and the location effect are considered in the correction process, the imaging quality is substantially improved. Other embodiments and modifications may be implemented without departing from the spirit of the present disclosure.

Figure 5:
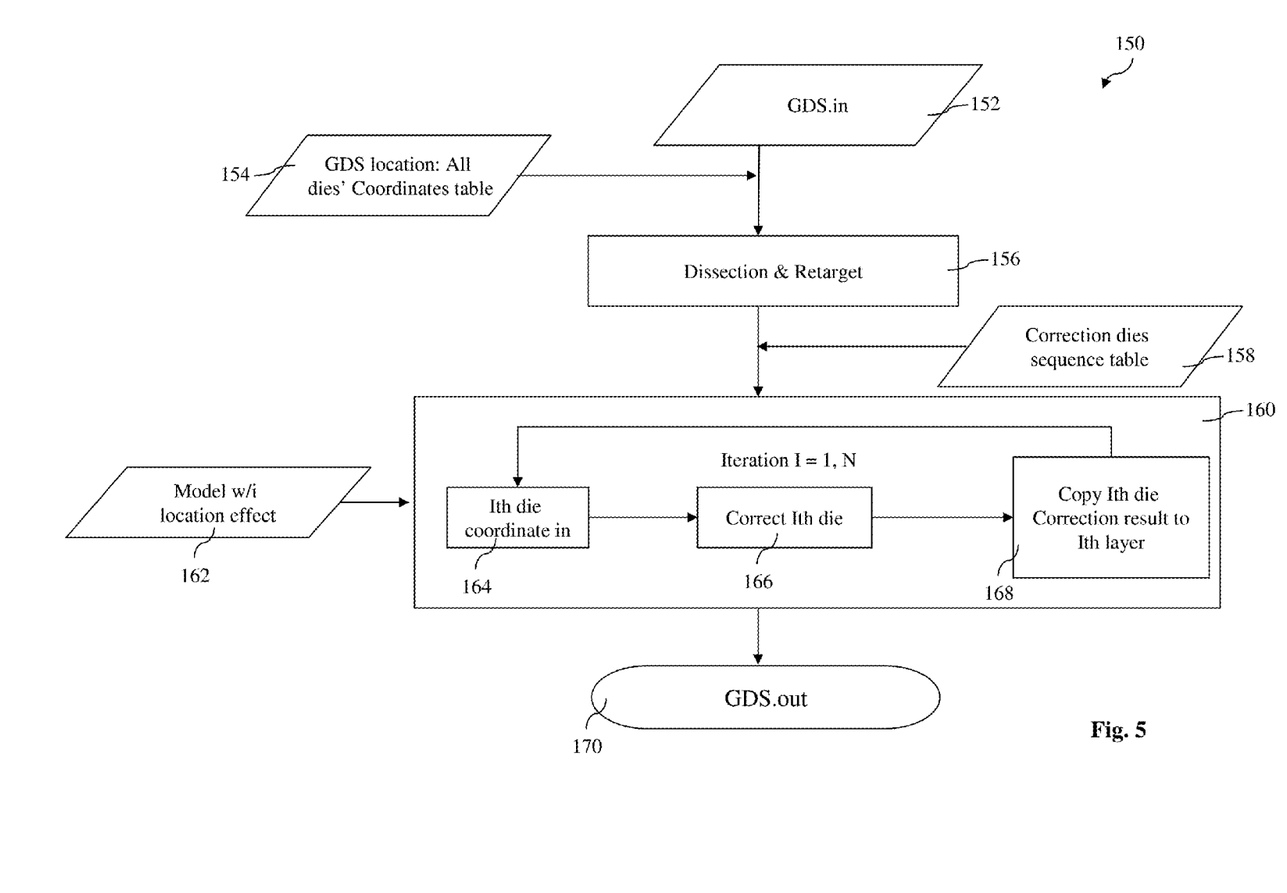
FIG. 5 is a block diagram illustrating an IC design flow constructed according to aspects of the present disclosure in one embodiment.

FIG. 5 is a block diagram illustrating an IC design (flow) method 150 constructed according to aspects of the present disclosure in one embodiment. The IC design method 150 is one embodiment or an alternative of the IC design method 100 of FIG. 1. Similar descriptions are omitted for simplicity. The method 150 includes a step 152 by receiving an IC design layout as an input. In one example, the IC design layout is in GDS format.

The method 150 proceeds to a step 154 by providing or receiving a coordinate table that includes the coordinates of the all dies (or IC regions) in the IC design layout.

The method 150 proceeds to a step 156 by performing dissection and retarget to the IC design layout.

The method 150 proceeds to a step 158 by providing or generating a correction sequence table of the dies (or IC regions) of the IC design layout.

The method 150 proceeds to a step 160 by performing correction to the IC design layout using a correction model that includes location effect. The correction process 160 includes an iteration procedure that corrects each die sequentially according to the correction sequence table. When the correction is applied to each die, it further includes a first step 164 for i-th die coordinate input, and a second step 166 for correcting the IC pattern in that i-th die using the correction model 162. The second step 166 includes another iteration procedure to adjust the IC pattern many times until the contour of the IC pattern in that die satisfies the assigned targets. The correction process 160 further includes a third step by copying the corrected IC pattern of the i-th die to the i-th layer of the IC design layout. In other words, the corrected IC pattern of the i-th die is used as an input to the (i−1)-th die for its correction. When the correction is applied to the (i+1)-th die, the initial IC pattern is the corrected IC pattern of the i-th die, which is taken from the i-th layer.

The method 150 ends with a modified IC design layout to form a tape-out of the IC design layout.

Figure 6:
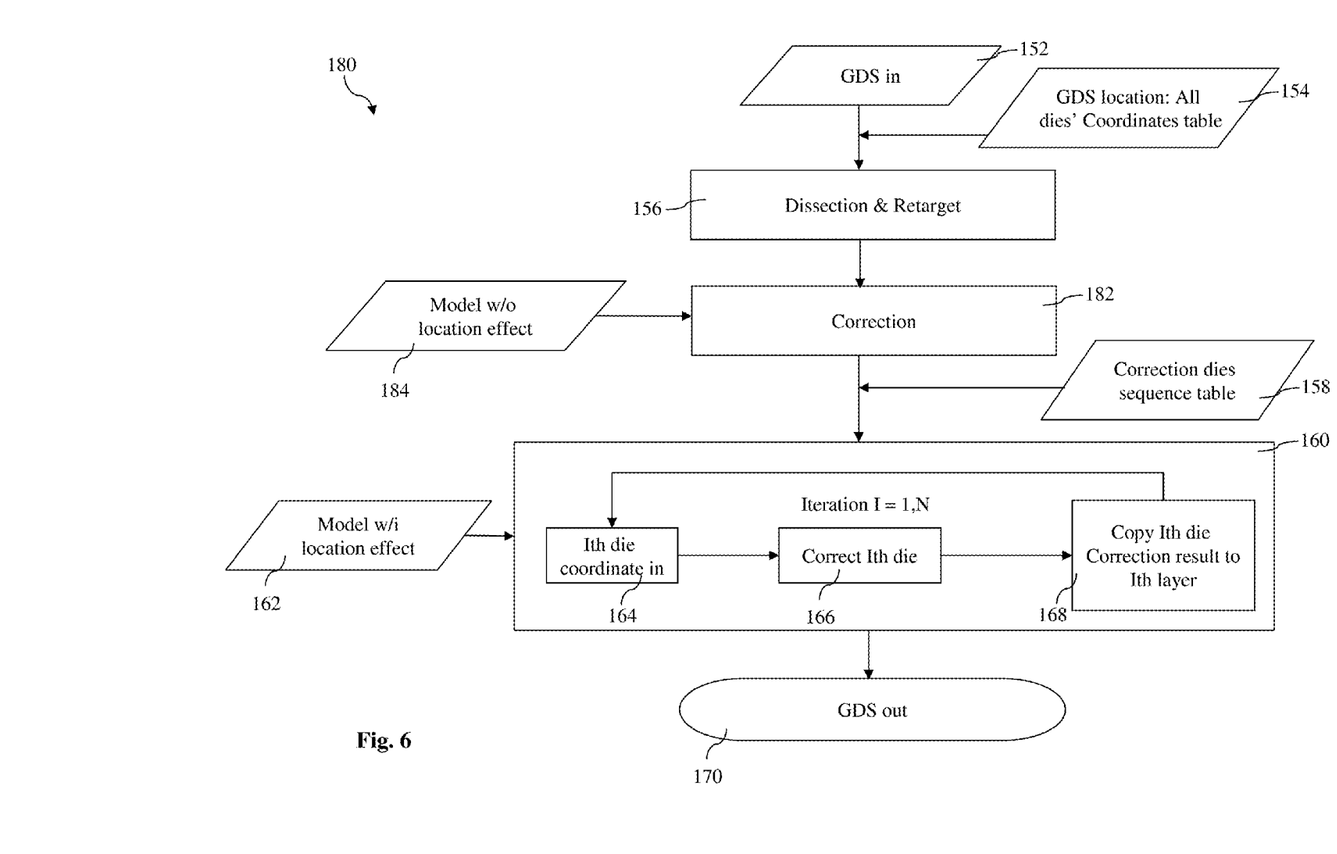
FIG. 6 is a block diagram illustrating an IC design flow constructed according to aspects of the present disclosure in another embodiment.

FIG. 6 is a block diagram illustrating an IC design (flow) method 180 constructed according to aspects of the present disclosure in another embodiment. The IC design method 180 is one embodiment or an alternative of the IC design method 100 of FIG. 1. The method 180 is similar to the method 150 of FIG. 5 but includes an additional correction step 182 using a correction model 184 that does not include the location effect. In one example, the correction model 184 includes an OPC model. The correction step 182 is implemented before the correction step 160. Since the correction step 182 does not consider the location effect, all dies have the same correction. The correction 182 may be applied to one die and copy the corrected results to the rest dies.

Thus, the present disclosure provides an integrated circuit (IC) method. The IC design method includes receiving an IC design layout having a plurality of IC regions each including an IC pattern; performing a dissection process to the IC design layout; and performing a correction process to the IC design layout using a correction model that includes proximity effect and location effect. The correction process includes performing a first correction step to a first IC region of the IC regions, resulting in a first corrected IC pattern in the first IC region; and performing a second correction step to a second IC region of the IC regions, starting with the first corrected IC pattern, resulting in a second corrected IC pattern.

In one embodiment of the IC method, the performing a correction process to the IC design layout includes performing a third correction step to a third IC region of the IC regions starting with the second corrected IC pattern, resulting in a third corrected IC pattern.

In another embodiment, the IC method further includes providing a correction sequence table of the IC regions; and performing a respective correction step to other IC regions of the IC regions in a sequence defined in the correction sequence table, using a corrected IC pattern from a preceding IC region as an input.

In yet another embodiment, the performing a second correction step to a second IC region includes performing the second correction step in an iteration mode until the second corrected IC pattern is acceptable according a predefined criteria.

In yet another embodiment, the IC method further includes providing a coordinate table of the IC regions, wherein the performing a correction process to the IC design layout includes applying the correction process to each IC region of the IC regions using the model and respective coordinates of the IC region in the coordinate table of the IC regions.

In yet another embodiment, the IC method further includes performing a retargeting process to the IC design layout using a set of retarget rules before the performing a correction process and after the performing a dissection process.

In yet another embodiment, the performing a retargeting process to the IC design layout includes performing the retargeting process to the IC pattern to generate a retargeted IC pattern and replace the IC pattern in each of the IC region by the retargeted IC pattern.

In yet another embodiment, the performing a first correction step to a first IC region of the IC regions includes performing the first correction step to the first IC region of the IC regions using the retargeted IC pattern as an input.

In yet another embodiment, the retarget rules include a first set of rules associated with the proximity effect and a second set of rules associated with the location effect.

In yet another embodiment, each of the plurality of IC regions is associated with one IC die and the IC pattern in each of the IC regions is identical.

In yet another embodiment, the IC method further includes performing another correction process to the IC design layout using another model associated only with proximate effect before the performing a correction process to the IC design layout.

The present disclosure also provides another embodiment of an IC method that includes receiving an IC design layout having a plurality of IC regions each including an IC pattern; performing dissection to the IC design layout; performing a retargeting process to the IC design layout in a rule-based mode; providing a correction sequence table that arranges the IC regions in a sequence; and performing a correction process to the IC design layout using a correction model that includes proximity effect and location effect. The correction process includes applying a first correction to a preceding IC region of the IC regions, resulting in a first correct IC pattern in the IC region; and applying a second correction to a succeeding IC region of the IC regions in the sequence using the first corrected IC pattern as an input, resulting in a second corrected IC pattern.

In one embodiment of the IC method, the performing a correction process to the IC design layout includes performing the correction process to rest of the IC regions according to the sequence until the IC regions are exhausted.

In another embodiment, the IC method further includes providing a coordinate table that includes a set of coordinates associated with the IC regions, respectively.

In yet another embodiment, the performing a retargeting process to the IC design layout includes applying the retargeting process to the IC pattern to generate a retargeted IC pattern; and replacing the IC pattern in each IC region with the retargeted IC pattern.

In yet another embodiment, the applying the correction process to the succeeding IC region includes applying the correction process to the succeeding IC region according to respective set of coordinates associated with the succeeding IC region.

In yet another embodiment, the applying the correction process to a succeeding IC region of the IC regions includes correcting the first corrected IC pattern according to the location effect and respective set of coordinates, resulting in a modified IC pattern; simulating the modified IC pattern using the correction model to generate a contour of the modified IC pattern; evaluating the contour of the modified IC pattern if the contour is acceptable according to a criteria; and correcting the modified IC pattern according to the location effect and the respective set of coordinates if the contour is unacceptable.

In yet another embodiment, the correction sequence table arranges IC regions in a way such that adjacent IC regions have similar sensitivity of the location effect.

In yet another embodiment, the IC method further includes performing another correction process to the IC design layout using another correction model that includes the proximate effect and does not include the location effect, prior to the performing a correction process to the IC design layout using the correction model that includes the proximity effect and location effect.

The present disclosure also provides another embodiment of an IC method. The IC method includes receiving an IC design layout having a plurality of IC regions each including an identical IC design pattern; providing a coordinate table that includes a set of coordinates associated with the IC regions, respectively; performing dissection to the IC design layout such that the IC design pattern is segmented; performing a retargeting process to the IC design layout in a rule-based mode; performing a first correction process to the IC design layout using a first model that includes proximate effect but does not include location effect; providing a correction sequence table that arranges the IC regions in a sequence; and performing a second correction process to the IC design layout using a second model that includes the proximity effect and the location effect. The performing a second correction process includes applying the correction process to a preceding IC region of the IC regions, resulting in a first corrected IC pattern in the preceding IC region; and applying the correction process to a succeeding IC region of the IC regions in the sequence using the first corrected IC pattern as an input, resulting in a second corrected IC pattern to the succeeding IC region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) method comprising:
    receiving an IC design layout having a plurality of non-overlapping IC regions, each of the IC regions including a same initial IC pattern, and wherein each of the plurality of IC regions is associated with a different IC die;
    performing a dissection process to the IC design layout;
    performing a correction process to the IC design layout using a correction model that includes proximity effect and location effect, wherein the correction process includes:
        performing a first correction step to a first IC region of the plurality of IC regions, thereby modifying the initial IC pattern to result in a first corrected IC pattern in the first IC region,
        copying the first corrected IC pattern to a second IC region of the plurality of IC regions, thereby replacing the initial IC pattern of the second IC region with the first corrected IC pattern; and
        after copying, performing a second correction step to the second IC region of the plurality of IC regions, wherein the performing the second correction step includes starting with the copied first corrected IC pattern and resulting in a second corrected IC pattern; and
    taping-out the second corrected IC pattern to provide a taped-out pattern accessible by at least one of a mask making tool and an e-beam lithography tool.

2. The IC method of claim 1, wherein the performing the correction process to the IC design layout includes copying the second corrected IC pattern to a third IC region of the plurality of IC regions, and performing a third correction step to the third IC region of the plurality of IC regions starting with the second corrected IC pattern, and resulting in a third corrected IC pattern.

3. The IC method of claim 1, further comprising:
providing a correction sequence table of the plurality of IC regions, wherein the correction sequence table identifies the first and second IC regions; and
performing a respective correction step to each of the plurality of IC regions in a sequence defined in the correction sequence table.

4. The IC method of claim 1, wherein the performing the second correction step to the second IC region includes performing the second correction step in an iteration mode until the second corrected IC pattern is acceptable according a predefined criteria.

5. The IC method of claim 1, further comprising providing a coordinate table including of coordinates for each of the plurality IC regions, wherein the performing the correction process to the IC design layout includes applying the correction process to each of the plurality of IC regions using the model and respective coordinates of a selected IC region provided in the coordinate table of the plurality of IC regions.

6. The IC method of claim 1, further comprising performing a retargeting process to the IC design layout using a set of retarget rules before the performing the correction process and after the performing the dissection process.

7. The IC method of claim 6, wherein the retarget rules include a first set of rules associated with the proximity effect and a second set of rules associated with the location effect.

8. The IC method of claim 6, wherein the performing the retargeting process to the IC design layout includes performing the retargeting process to the IC pattern to generate the initial.

9. The IC method of claim 1, further comprising performing another correction process to the IC design layout using another model associated only with the proximity effect before the performing the correction process to the IC design layout.

10. A method comprising:
receiving an integrated circuit (IC) design layout having a plurality of non-overlapping IC regions, each of the plurality of IC regions including a first IC pattern having a plurality of main features;
generating a correction sequence table that arranges the plurality of IC regions in a sequence, wherein the sequence designates a first IC region and an adjacent second IC region of the plurality of IC regions;
after generating the correction sequence table, performing a correction process to the IC design layout using a correction model that includes proximity effect and location effect, wherein the correction process includes:
applying a first correction to the designated first IC region of the IC regions, resulting in a first corrected IC pattern in the first IC region, and
applying a second correction to the designated second IC region of the plurality of IC regions using the first corrected IC pattern as an input, resulting in a second corrected IC pattern; and
using at least one of the first corrected IC pattern and the second corrected IC pattern to pattern a semiconductor wafer to provide plurality of features on the semiconductor wafer defined by the second corrected IC pattern.

11. The method of claim 10, wherein the performing the correction process to the IC design layout includes performing the correction process to rest of the plurality of IC regions according to the sequence until the plurality of IC regions are exhausted.

12. The method of claim 10, further comprising providing a coordinate table that includes a set of coordinates associated with each of the IC regions.

13. The method of claim 10, further comprising, prior to performing the correction process, performing a retargeting process to the IC design layout in a rule-based mode, wherein the performing the retargeting process to the IC design layout includes:
applying the retargeting process to the IC pattern to generate a retargeted IC pattern; and
replacing the IC pattern in each of the plurality of IC regions with the retargeted IC pattern.

14. The method of claim 10, wherein the applying the correction process to the designated second IC region includes applying the correction process to the designated second IC region according to a respective set of coordinates associated with the designated second IC region.

15. The method of claim 12, wherein the applying the correction to the designated second IC region of the IC regions includes:
correcting the first corrected IC pattern according to the location effect and respective set of coordinates, resulting in a modified IC pattern;
simulating the modified IC pattern using the correction model to generate a contour of the modified IC pattern;
evaluating the contour of the modified IC pattern if the contour is acceptable according to a criteria; and
correcting the modified IC pattern according to the location effect and the respective set of coordinates if the contour is unacceptable.

16. The method of claim 10, wherein the correction sequence table sequences the plurality of IC regions such that adjacent IC regions have similar sensitivity of the location effect.

17. The method of claim 10, further comprising performing another correction process to the IC design layout using another correction model that includes the proximity effect and does not include the location effect, prior to the performing the correction process to the IC design layout using the correction model that includes the proximity effect and location effect.

18. A method comprising:
receiving an IC design layout having a plurality of IC regions, each of the IC regions including an identical IC design pattern;
providing a coordinate table that includes a set of coordinates associated with each of the plurality of IC regions, respectively;
performing a first correction process to the IC design layout using a first model that includes proximity effect but does not include location effect, wherein the first correction process is applied to the plurality of IC regions;
providing a correction sequence table that assigns each of the plurality of IC regions a sequence order designation, wherein the assignment is based on a similarity of a location effect for each of the plurality of IC regions; and
performing a second correction process to the IC design layout using a second model that includes the proximity effect and the location effect, wherein the performing the second correction process includes:
using the correction sequence table to identify a first IC region of the plurality of IC regions;

applying a first adjustment process to the identified first IC region of the plurality of IC regions, resulting in a first corrected IC pattern in the first IC region,
identifying a second IC region of the plurality of IC regions using the correction sequence table;
copying the first IC region to applying the correction process to the identified second IC region, resulting in a second corrected IC pattern in the second IC region; and
taping-out the IC layout including the second corrected IC pattern to provide a taped-out pattern accessible by at least one of a mask making tool and an e-beam lithography tool.

\* \* \* \* \*